United States Patent [19]
Watanabe et al.

[11] Patent Number: 5,481,490
[45] Date of Patent: Jan. 2, 1996

[54] FERROELECTRIC MEMORY

[75] Inventors: Hitoshi Watanabe, Tokyo; Yoshimi Kuroda, Funabashi; Kaoru Tadokoro, Tokyo, all of Japan

[73] Assignees: Olympus Optical Co., Ltd., Tokyo, Japan; Symetrix Corporation, Colorado Springs, Colo.

[21] Appl. No.: 319,809

[22] Filed: Oct. 7, 1994

[30] Foreign Application Priority Data

Oct. 12, 1993 [JP] Japan .................................. 5-254378

[51] Int. Cl.⁶ .................................................. G11C 11/22
[52] U.S. Cl. ............................................ 365/145; 365/53
[58] Field of Search ...................... 365/145, 53, 189.01

[56] References Cited

U.S. PATENT DOCUMENTS 3,701,121  10/1972  Fraser ........................... 365/145

FOREIGN PATENT DOCUMENTS

2-183569  7/1990  Japan .
5-90606   4/1993  Japan .

*Primary Examiner*—Terrell W. Fears
*Attorney, Agent, or Firm*—Frishauf, Holtz, Goodman, Langer & Chick

[57] ABSTRACT

Disclosed is a ferroelectric memory, comprising a semiconductor substrate, a ferroelectric thin film capacitor of a laminate structure formed on the substrate, the laminate structure consisting of a lower electrode, an oxide ferroelectric thin film and an upper electrode, and a protective thin film formed to cover at least the upper surface of the capacitor and consisting essentially of a nitride of aluminum, silicon or titanium.

28 Claims, 4 Drawing Sheets

(PRIOR ART)

FIG. 9

FERROELECTRIC MEMORY

BACKGROUND OF THE INVENTION

1. Field of the Invention

The present invention relates to a ferroelectric memory, particularly, to a ferroelectric memory utilizing the residual polarization characteristics of an oxide ferroelectric thin film.

2. Description of the Related Art

Ferroelectric compounds exhibit singular electrical characteristics and, thus, are used in various fields including, for example, a piezoelectric filter or an ultrasonic transducer utilizing piezoelectric characteristics, an infrared sensor or an image sensing device utilizing pyroelectricity and a light-modulated element or an optical shutter utilizing electro-optical characteristics. Further, an electronic device utilizing a thin film of a ferroelectric compound has already been developed, and vigorous efforts are being made in an attempt to decrease the thickness of the ferroelectric film. Particularly, a nonvolatile memory device having a ferroelectric thin film capacitor mounted thereon, which utilizes the stability of the residual polarization of the ferroelectric thin film, attracts special attentions nowadays because severe competition is being carried out recently in an attempt to improve the memory capacity and degree of integration of the memory device.

A series of lead-containing complex oxide ferroelectric compounds such as PZT (lead titanate zirconate) and PLZT (lanthanum lead titanate zirconate) are typical materials which are being vigorously studied for practical use in various fields by many researches over many years.

A bismuth stratified perovskite type oxide is another prospective ferroelectric material because a ferroelectric thin film formed of oxide of this type exhibits an excellent fatigue resistance. Specifically, the number of recording/erasing operations achieved by the particular ferroelectric thin film is hundreds of times as many as that for the conventional ferroelectric thin film formed of PZT or PLZT. Thus, the ferroelectric thin film formed of a bismuth stratified perovskite type oxide can be used in a nonvolatile memory device having a high durability and in other electronic and optical devices.

The ferroelectric thin film can be formed by physical film-forming methods such as a sputtering method using as a target a ceramic material baked in advance and a reactive vapor deposition of metal, a CVD method in which an organometallic compound is deposited in a vapor phase, a sol-gel method in which coating of a solution of a ferroelectric compound is utilized for forming a film, a MOD method, etc.

Figure 9:
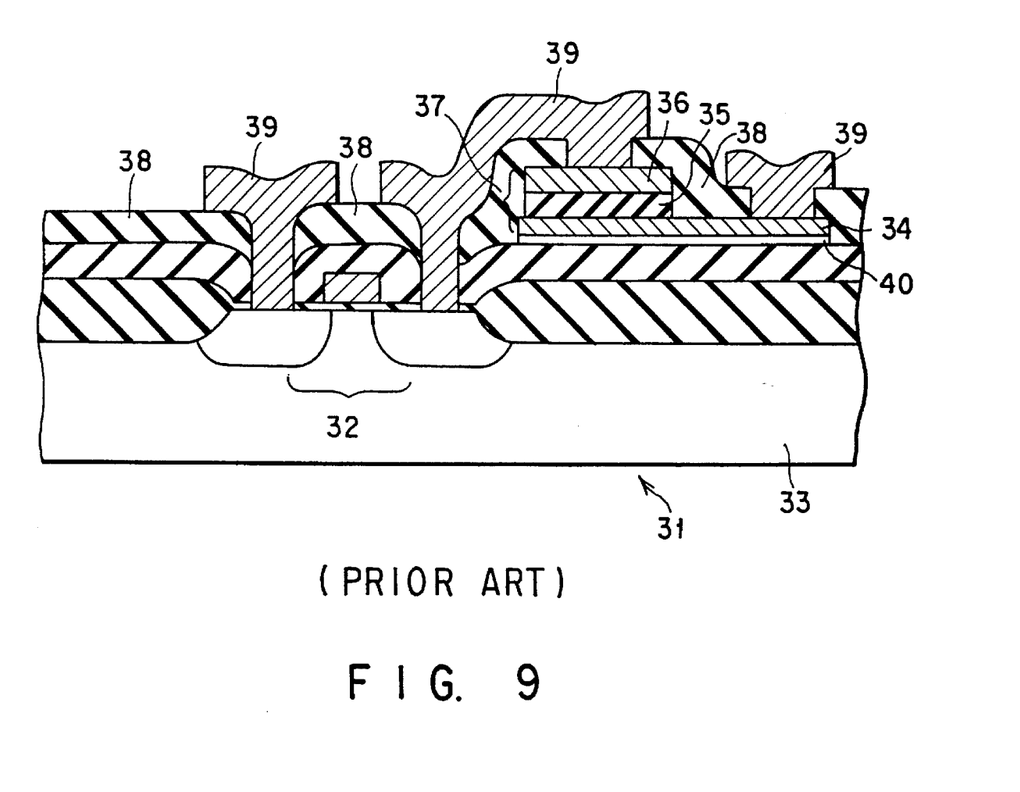
FIG. 9 is a cross sectional view showing a conventional ferroelectric memory.

In general, a ferroelectric material exhibits hysteresis characteristics in respect of the residual polarization. The hysteresis characteristics are utilized for storing data in a nonvolatile memory. FIG. 9 shows the construction of a conventional ferroelectric memory 31 using a ferroelectric material. As shown in the drawing, a ferroelectric thin film capacitor 37 is formed on a silicon semiconductor substrate 33 having peripheral elements 32 such as a switching element comprising a MOS transistor, and an amplifier formed therein. The capacitor 37 is formed by successively laminating a lower electrode 34 made of, for example, platinum, a ferroelectric thin film 35 and an upper electrode 36 on the silicon substrate 33. Further, an interlayer insulating film 38 made of silicon oxide is formed by a sputtering method or a CVD method, followed by forming an electrode wiring 39 for connecting the elements to each other.

In addition to the basic structure described above, a protective layer (not shown) is formed, if necessary, so as to protect an under-layer 40 serving to improve the adhesivity of the lower electrode 34 to the substrate and the ferroelectric thin film capacitor from various changes in environment. Some improvements in the protective film of a ferroelectric memory are proposed to date, as exemplified below:

(1) Japanese Patent Disclosure No. 2-183569 teaches that a $Ti_3N_4$ layer is formed between a ferroelectric PZT thin film and an upper electrode and, at the same time, the PZT thin film is covered directly with a $Si_3N_4$ layer, so as to prevent oxygen from being released from the PZT layer and, thus, to improve the switching fatigue characteristics.

(2) Japanese Patent Disclosure No. 5-90606 teaches that a capacitor upper electrode is formed by laminating a first conductive film consisting of platinum or palladium and a second conductive film consisting of titanium nitride, titanium-tungsten alloy or molybdenum silicide so as to prevent alloying between the aluminum wiring electrode and the first conductive layer and, thus, to make a heat treatment in the subsequent step possible.

However, in the manufacturing process of the conventional ferroelectric memory described above, a ferroelectric thin film formed by a sputtering method or a spin-on method is subjected to a heat treatment at a relatively high temperature of 600° to 900° C. because such a heat treatment is absolutely necessary for the crystallization of the ferroelectric thin film. The manufacturing process also comprises, for example, an ion milling step utilizing a high energy beam and a reactive plasma etching step in which the ferroelectric thin film is exposed to a plasma bombardment. As a result, numerous lattice defects are generated in the single crystal structure of the semiconductor silicon substrate, leading to deterioration in the characteristics of the MOS transistor formed on the substrate.

To overcome the difficulty, a heat treatment (MOS sintering) is performed in the final step at 350° to 450° C. under a hydrogen-nitrogen mixed gas (forming gas) atmosphere. In this heat treatment, defects such as dangling bonds generated in the monocrystalline silicon substrate are eliminated by utilizing the reducing property of the hydrogen gas so as to restore the MOS characteristics.

In the prior art, however, the electrode for the ferroelectric thin film is formed of, for example, platinum which readily transmits hydrogen, giving rise to a serious problem. Specifically, hydrogen is diffused during the heat treatment under a reducing atmosphere through the interlayer insulating film and the upper electrode so as to arrive at the interface between the upper electrode and the ferroelectric thin film and at the side surface of the capacitor. What should be noted is that the oxide in the vicinity of the interface is decomposed by an oxidation-reduction reaction caused by the reducing function of the hydrogen arriving at the interface. In other words, the adhesivity of the ferroelectric thin film to the upper electrode is lowered by the chemical change taking place at the interface. Alternatively, the upper electrode is pushed up by the oxygen gas, water, etc. generated by the oxidation-reduction reaction noted above. It follows that peeling is likely to take place at the interface between the upper electrode and the ferroelectric thin film.

Further, the hydrogen gas is considered to be diffused through the side surface of the capacitor to reach the lower electrode. Thus, in the case of using an Al—Si electrode wiring in which a relatively large internal stress is likely to remain, the entire capacitor tends to be peeled off the semiconductor substrate itself. It is of course important to take measures against the particular problem in forming a ferroelectric memory by combining a ferroelectric thin film capacitor and a silicon semiconductor device.

SUMMARY OF THE INVENTION

An object of the present invention is to provide a ferroelectric memory comprising an oxide ferroelectric thin film capacitor and a silicon device and constructed such that the ferroelectric thin film is prevented from being peeled off the upper and/or lower electrodes in the MOS sintering step under a reducing atmosphere.

According to the present invention, there is provided a ferroelectric memory comprising a semiconductor substrate, a ferroelectric thin film capacitor of a laminate structure consisting of a lower electrode, an oxide ferroelectric thin film and an upper electrode formed in this order on the substrate, and a protective film consisting essentially of a nitride of aluminum, silicon or titanium and formed to cover at least the upper surface of the capacitor.

The present invention also provides a ferroelectric memory comprising a semiconductor substrate, an element separating region formed on a surface region of the substrate, a MOS transistor formed in an element region surrounded by the element separating region and comprising a source region, a drain region and a gate electrode, a first interlayer insulating film formed to cover the entire surface of the substrate, a ferroelectric thin film capacitor formed on the first interlayer insulating film positioned on the element separating region and including a lower electrode, a ferroelectric thin film and an upper electrode, and a protective layer formed to cover at least the upper surface of the capacitor and consisting essentially of a nitride of aluminum, silicon or titanium.

Further, the present invention provides a method of manufacturing a ferroelectric memory, comprising the steps of forming an element separating region in a surface region of a semiconductor substrate; forming a MOS transistor having a source region, a drain region and a gate electrode within an element region surrounded by the element separating region; forming an interlayer insulating film on the entire surface of the substrate; forming a lower electrode on the interlayer insulating film positioned on the element separating region; forming a ferroelectric thin film on the lower electrode; forming an upper electrode on the ferroelectric thin film, the lower electrode, ferroelectric thin film and upper electrode collectively forming a ferroelectric thin film capacitor; and forming a protective film to cover at east the upper surface of the capacitor, the protective film consisting essentially of a nitride of aluminum, silicon or titanium.

In the present invention, a protective film preventing a reducing gas from being diffused into the device is formed to cover the surface of the upper electrode included in the ferroelectric thin film capacitor and the side surface of the capacitor. Alternatively, some of the elements constituting the ferroelectric thin film are contained in an excessive amount in the thin film. As a result, it is possible to inhibit a reducing reaction on the surface of the oxide ferroelectric thin film so as to suppress deterioration of the device. It is also possible to prevent the difficulty accompanying the conventional forming treatment, i.e., peeling of the upper and lower electrodes from the ferroelectric thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

In the present invention, a thin film of a nitride of aluminum, silicon or titanium is used as a protective layer. The nitride film has a relatively high density and is chemically stable, compared with an oxide film. In addition, a hydrogen gas does not permeate through the nitride thin film. It is desirable to set the thickness of the nitride protective film to fall within a range of between 20 nm and 100 nm.

The nitride thin film can be formed by various known methods such as a DC or RF sputtering method, ion beam deposition method, CVD method and, in some cases, a sol-gel method.

In the present invention, it is important to prevent a reducing gas from being diffused into the device. It is also important to use a reinforcing layer serving to improve the adhesivity of the nitride thin film to an upper electrode or to an interlayer insulating film. In the case of forming a laminate structure consisting of a nitride thin film and another thin film, it is generally desirable to use a reinforcing layer consisting of an oxide of the metal contained in the nitride thin film. The presence of an oxide reinforcing layer does not impair the effect of preventing the electrode from being peeled off, the effect being produced by the nitride thin film.

To reiterate, the protective layer used in the present invention is formed of a nitride of aluminum, silicon or titanium. In the case of using a nitride of titanium or aluminum, the nitride thin film permits maintaining an electrical conductivity. Thus, the hydrogen shielding effect can be enhanced by forming the nitride thin film to cover the entire surface of the upper electrode included in the capacitor. In the case of using a protective film formed of silicon nitride, it is necessary to form a contact hole through the protective film for electrical connection between a wiring electrode and the upper electrode because the silicon nitride film is an insulating film. Since the protective film is partly removed for forming the contact hole, the hydrogen shielding effect produced by the protective film is somewhat lowered. However, since the side surface of the capacitor can be directly covered with the protective film, it is possible to prevent the hydrogen gas from being diffused sideward of the capacitor. Further, protective films of different kinds can be used in combination. For example, it is possible to cover the surface of the upper electrode with a protective film of aluminum nitride or titanium nitride, with the side surface of the capacitor being covered with a protective film of silicon nitride.

Alternatively, a ferroelectric thin film substantially equal in composition or in some constituting elements to the ferroelectric thin film included in the capacitor can also be used as a protective film covering the surface of the upper electrode included in the capacitor. In the case of using the particular protective thin film, the hydrogen diffused through the wiring electrode and the interlayer insulating film to reach the surface of the protective film is consumed for the reducing reaction with the oxide ferroelectric material, resulting in failure to be further diffused through the upper electrode into the inner region of the device.

It is most desirable for the protective film to be formed of a ferroelectric material equal to the material of the capacitor ferroelectric thin film in composition, crystal structure and the reactivity with hydrogen. It should be noted, however, that, where the memory device is constructed to comprise a plurality of different kinds of electrode layers or metal layers, which are interposed between the capacitor ferroelectric thin film and the protective layer, the device operation itself tends to be impaired if the protective layer is formed of a ferroelectric material in place of a simple dielectric material. In such a case, it is desirable to control the baking temperature in the step of forming a protective layer at a crystallizing temperature or less of the ferroelectric material so as to make the protective layer amorphous or crystallize the protective layer only partially and, thus, to suppress the development of the ferroelectric property.

The protective thin film material which reacts with a reducing gas to suppress the diffusion of the reducing gas into the inner region is not necessarily equal in composition to the oxide ferroelectric material forming the ferroelectric thin film capacitor. Specifically, compounds having some constituent elements replaced therein or specified elements removed therefrom can also be used for forming the protective film. For example, a protective thin film made of $SrTa_2O_6$ or $SrBi_2Nb_2O_9$ can be used satisfactorily in the case where a $SrBiTa_2O_9$ is used for forming the ferroelectric thin film capacitor. In this case, the protective film, if oxidized sufficiently, may naturally be a crystallized film, a partially crystallized film, or an amorphous film.

Further, the protective film may also be formed at the interface between the upper surface of the interlayer insulating film directly covering the capacitor and the lower surface of the electrode wiring in addition to the protective film covering the upper surface of the capacitor, with substantially the same effect. It is also possible to form an under-layer equal in composition and construction to the protective film at the interface between the adhesive film and the BPSG film. The under-layer (protective film) permits preventing a reducing gas from being diffused into the device through the side surface of the capacitor so as to prevent the lower electrode from being peeled off.

Naturally, it is also possible to cover the entire surface of the ferroelectric memory with the protective film defined in the present invention so as to suppress the detrimental effect given by a reducing gas to the ferroelectric thin film capacitor. In this case, the protective film may be of a multi-layer structure. Also, the protective film may be formed with, for example, a silicon oxide film interposed between the surface of the ferroelectric memory and the protective film. Alternatively, the silicon oxide film may be formed on the protective film covering the entire surface of the ferroelectric memory. Where the entire surface of the ferroelectric memory is covered with the protective film, the hydrogen diffusion may possibly be suppressed excessively by the protective film, resulting in failure to supply hydrogen to the MOS transistor section in an amount sufficient for restoring the MOS transistor characteristics. To overcome this difficulty, the protective film may be removed from above the MOS transistor section.

In the ferroelectric memory of the present invention comprising a protective film serving to prevent the capacitor electrode from being peeled off, the ferroelectric material forming the ferroelectric thin film included in the capacitor is not particularly restricted. However, it is desirable to use a bismuth stratified perovskite type compound represented by general formula (I) given below for forming the oxide ferroelectric thin film:

$$(Bi_2O_2)^{2+}(A_{m-1}B_mO_{3m+1})^{2-} \qquad (I)$$

where A is at least one element selected from the group consisting of Bi, Pb, Ba, Sr, Ca, Na, K and Cd, B is at least one element selected from the group consisting of Ti, Nb, Ta, W, Mo, Fe, Co and Cr, and m is an integer of 1 to 5.

In the case of using the compound represented by general formula (I), the element B is distributed in the resultant ferroelectric thin film to have a gradient of concentration in the thickness direction of the film such that the interface between the ferroelectric thin film and the upper electrode is rich in the element B. In this case, a prominent effect of preventing the capacitor electrode from being peeled off can be obtained by controlling appropriately the composition itself of the ferroelectric material.

The element B contained in the compound represented by general formula (I) denotes elements which are used in many cases in the form of elemental metals or oxides thereof for forming an adhesive layer having a high adhesivity to silicon oxide or other metals and, thus, are suitable for forming a metal electrode, an under-layer, or an adhesive layer for bonding two adjacent layers differing from each other in thermal expansion coefficient or lattice constant.

It is possible to use the element B in an excessive amount in the step of forming the ferroelectric thin film. In this case, a layer of segregated fine oxide particles of the element B can be formed after the baking step on the surface of the ferroelectric thin film having a desired stoichiometric composition. The particular surface layer of the segregated fine oxide particles of the element B can also be formed by forming first a laminate structure consisting of a lower layer made of a stoichiometric composition of the ferroelectric material and an upper layer made of a composition containing an excessive amount of the element B, followed by baking the laminate structure.

As described above, the ferroelectric thin film included in the thin film capacitor, which is made of a bismuth stratified perovskite type compound, contains the element B to have a gradient of concentration in the thickness direction of the film such that the interface between the ferroelectric thin film and the upper electrode is rich in the element B. In the subsequent foaming treatment of the thin film capacitor which is carried out under a reducing atmosphere, the crystal structure of the thin film is partly reduced and destroyed, resulting in a slight decrease in the residual polarization and in increase in the resistance to electric field. However, the segregated oxides of the element B or partially reduced materials thereof perform an alloying reaction with the electrode metal, with the result that the interface between the ferroelectric thin film and the electrode is reinforced so as to prevent the electrode from being peeled off. Particularly, where the ferroelectric thin film included in the thin film capacitor is formed of a bismuth stratified perovskite type compound represented by $Sr_2(Ta_xNb_{1-x})_2O_9$ (x=0 to 1.0), where Ta or Nb is contained as the element B, it is possible to provide a ferroelectric memory excellent in both the absolute value of the residual polarization amount and the bonding strength of the electrode.

Let us describe some examples of the present invention and comparative examples with reference to the accompanying drawings.

EXAMPLE 1

Figure 1:
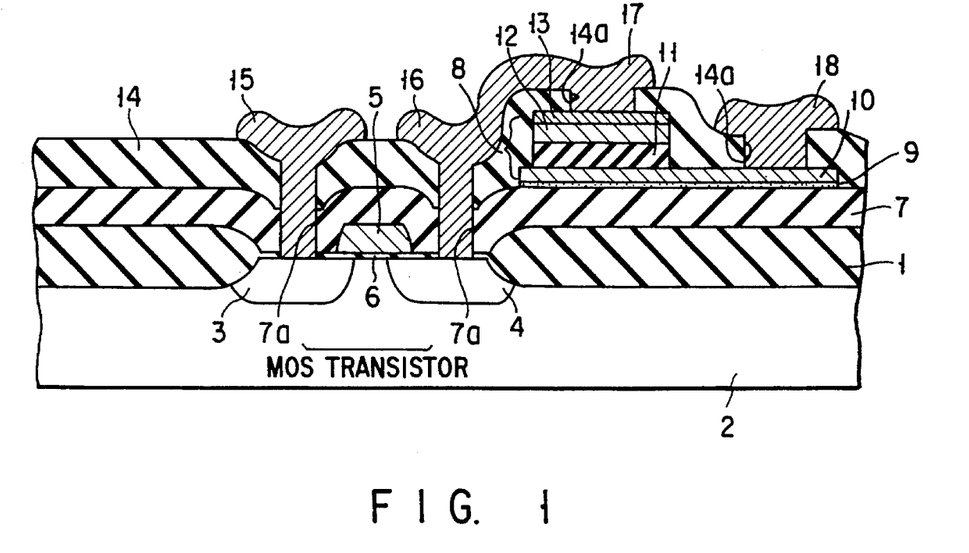
FIG. 1 is a cross sectional view showing a ferroelectric memory manufactured in Example 1 described herein later.

FIG. 1 shows a ferroelectric memory according to a first embodiment of the present invention. As shown in the drawing, an element separating region 1 is formed on a surface of a silicon substrate 2. A source region 3 and a drain region 4 are formed separately from each other within an element region surrounded by the element separating region 1. A gate insulating film 6 is formed on the silicon substrate 2 between the source and drain regions 3 and 4. Further, a gate electrode 5 is formed on the gate insulating film 6. These source region 3, drain region 4, gate insulating film 5 and gate electrode 6 collectively form a MOS transistor.

A BPSG (Boron-doped Phospho-Silicate Glass) film 7 is formed on the entire surface including the element separating region 1 of the substrate 2. A ferroelectric thin film capacitor 8 is formed on the BPSG film 7 on the element separating region 1 with an under-layer (adhesive layer) 9 interposed therebetween. The under-layer 9 is made of, for example, titanium and has a thickness of 20 nm. The ferroelectric thin film capacitor 8 comprises a lower electrode 10 made of platinum and having a thickness of 200 nm, a ferroelectric thin film 11 formed on the lower electrode 10, an upper electrode 12 formed on the ferroelectric thin film 11, made of platinum and having a thickness of 200 nm, and a protective film 13 formed on the upper electrode 12 and having a thickness of 50 nm. The ferroelectric thin film 11 consists of a sol-gel thin film of PZT (40/60).

An interlayer insulating film 14 is formed on the BPSG film 7 including the ferroelectric thin film capacitor 8. Openings 7a are formed through the interlayer insulating film 14 and the BPSG film 7 to selectively expose the surfaces of the source region 3 and the drain region 4, respectively. A source electrode wiring 15 and a drain electrode wiring 16 are formed to fill these openings 7a. Additional openings 14a are formed through the interlayer insulating film 14 to selectively expose the protective film 13 and the lower electrode 10 of the ferroelectric thin film capacitor 8, respectively. An upper electrode wiring 17 and a lower electrode wiring 18 are formed to fill these openings 14a. The drain electrode wiring 16 is electrically connected to the upper electrode wiring 17. Each of these wirings 15, 16, 17 and 18 is made of Al—Si.

The ferroelectric memory constructed as shown in FIG. 1 is manufactured as follows. In the first step, the element separating region 1 is formed on the surface of the silicon substrate 2 by the known technique such as a semiconductor fine processing technique, followed by forming the MOS transistor comprising the source region 3, drain region 4, gate electrode 5, etc. in the element region surrounded by the element separating region 1. Then, the BPSG film 7 is formed on the entire surface of the substrate 2, followed by forming the lower electrode 10 in a thickness of 200 nm on the element separating region 1 by a DC sputtering method with the adhesive layer 9 having a thickness of 20 nm interposed therebetween.

After formation of the lower electrode 10, the ferroelectric PZT thin film 11 is formed on the lower electrode 10. A sol-gel PZT precursor solution having a predetermined concentration and composition and having a partial hydrolysis applied thereto is used for forming the ferroelectric thin film 11. Specifically, the lower electrode 10 is coated with the precursor solution, followed by drying and calcinating the coating. These coating, drying and calcinating treatments are repeatedly applied to form a calcinated thin film, followed by applying a baking treatment to the calcinated thin film at a predetermined temperature under an oxygen atmosphere so as to obtain the ferroelectric PZT thin film 11 having a thickness of 300 nm. Then, the upper electrode 12 is formed in a thickness of 200 nm by a sputtering technique on the ferroelectric thin film 11. The thickness of the upper electrode 12 is equal to that of the lower electrode 10. Further, the protective film 13 consisting of AlN is formed in a thickness of 50 nm by a DC sputtering technique on the upper electrode 12. Finally, an ion milling treatment is applied to each of the lower and upper electrodes and the ferroelectric thin film 11 so as to form the ferroelectric thin film capacitor 8.

In the next step, the interlayer insulating film 14 is formed on the entire surface in a thickness of 400 nm by a predetermined process including the spin coating, drying and baking steps. Then, the openings 7a selectively exposing the source region 3 and drain 4 of the MOS transistor are formed through the laminate structure consisting of the interlayer insulating film 14 and the BPSG film 7. Likewise, the openings 14a selectively exposing the protective film 13 and the lower electrode 10 of the ferroelectric thin film capacitor 8 are formed through the interlayer insulating film 14. Then, a wiring film consisting of Al—Si is formed in a thickness of 300 nm on the entire surface by a sputtering technique, followed by patterning the wiring film by a known wet etching method so as to form the source electrode wiring 15, the drain electrode wiring 16, the upper electrode wiring 17 and the lower electrode wiring 18 in the openings 7a and 14a so as to manufacture a ferroelectric memory in which the ferroelectric thin film capacitor is electrically connected to the MOS transistor.

As described above, the ferroelectric memory shown in FIG. 1 comprises a MOS transistor and a ferroelectric thin film capacitor electrically connected to the MOS transistor. The MOS transistor comprises the source region 3, drain region 4, gate electrode 6, etc. formed in an element region. On the other hand, the ferroelectric thin film capacitor 8, which is formed on the element separating region 1, comprises the lower electrode 10 formed on the BPSG film 7 with the adhesive layer 8 interposed therebetween, the ferroelectric PZT thin film 11, and the upper electrode 12. What should be noted is that the upper surface of the capacitor 8, i.e., the surface of the upper electrode 12, is covered with the AlN protective layer 13 so as to prevent a reducing gas from being diffused into the capacitor 8. It follows that it is possible to prevent a reducing reaction on the surface of the ferroelectric thin film 11 and the peeling of the electrode caused by the reducing reaction.

EXAMPLE 2

A ferroelectric memory in Example 2 is exactly equal in construction to the ferroelectric memory shown in FIG. 1, except that a protective film 21 made of titanium nitride ($Ti_3N_4$) and having a thickness of 50 nm is used in place of the protective film 13 included in the memory shown in FIG. 1. The ferroelectric memory in Example 2 was found to be substantially equal in the produced effect to the memory shown in FIG. 1.

EXAMPLE 3

Figure 2:
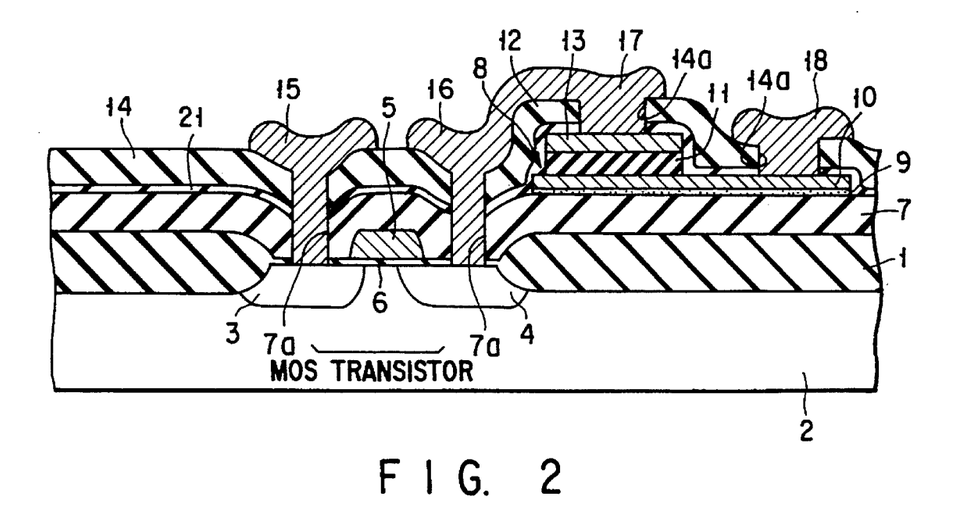
FIG. 2 is a cross sectional view showing a ferroelectric memory manufactured in Example 3 described herein later.

FIG. 2 shows a ferroelectric memory for Example 3. The reference numerals common with FIGS. 1 and 2 denote the same members of the memory and, thus, description thereof is omitted.

In Example 3, a protective film 21 consisting of silicon nitride ($Si_3N_4$) and having a thickness of 50 nm is formed to cover not only the upper surface but also the side surface of the ferroelectric thin film capacitor 8. The protective film 21 is formed by a DC sputtering of silicon nitride over the entire surface of the ferroelectric thin film capacitor 8. Since the silicon nitride protective film 21 is formed to cover both the upper and side surfaces of the ferroelectric thin film capacitor 8, a reducing gas is prevented from being diffused through not only the upper surface but also the side surface of the ferroelectric thin film capacitor 8 into the capacitor 8.

EXAMPLE 4

Figure 3:
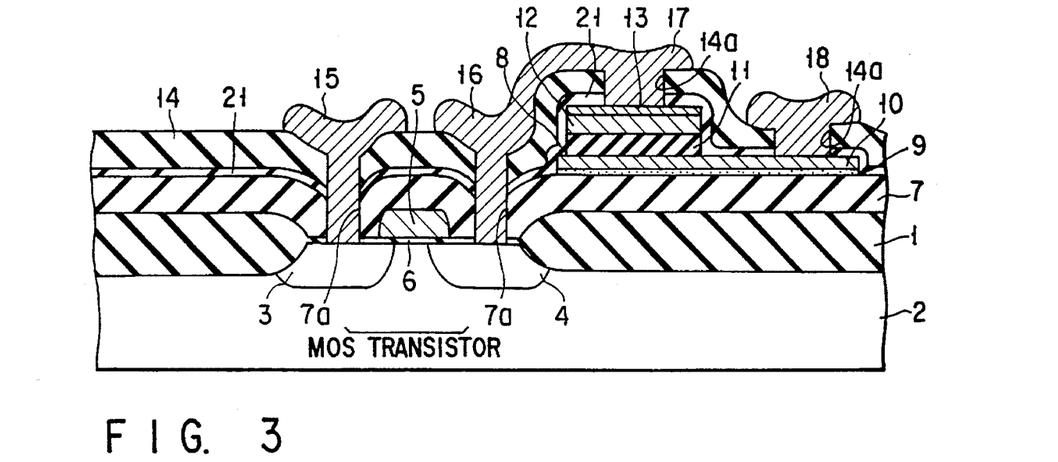
FIG. 3 is a cross sectional view showing a ferroelectric memory manufactured in Example 4 described herein later.

FIG. 3 shows a ferroelectric memory for Example 4. The reference numerals common with FIGS. 1, 2 and 3 denote the same members of the memory and, thus, description thereof is omitted.

In Example 4, the AlN protective film 13 formed to cover the upper surface of the ferroelectric thin film capacitor 8 is used in combination with the silicon nitride protective film 21 formed to partially cover the protective film 13 and to cover the side surface of the ferroelectric thin film capacitor 8. In this embodiment, a reducing gas such as a hydrogen gas is prevented from being diffused through not only the upper surface but also the side surface of the ferroelectric thin film capacitor 8 into the capacitor 8.

EXAMPLE 5

A ferroelectric memory in Example 5 is exactly equal in construction to the ferroelectric memory of Example 3 shown in FIG. 2, except that the protective film is of a double layer structure consisting of a silicon dioxide ($Si_2$) film having a thickness of 50 nm and a silicon nitride film having a thickness of 50 nm.

EXAMPLE 6

Figure 4:
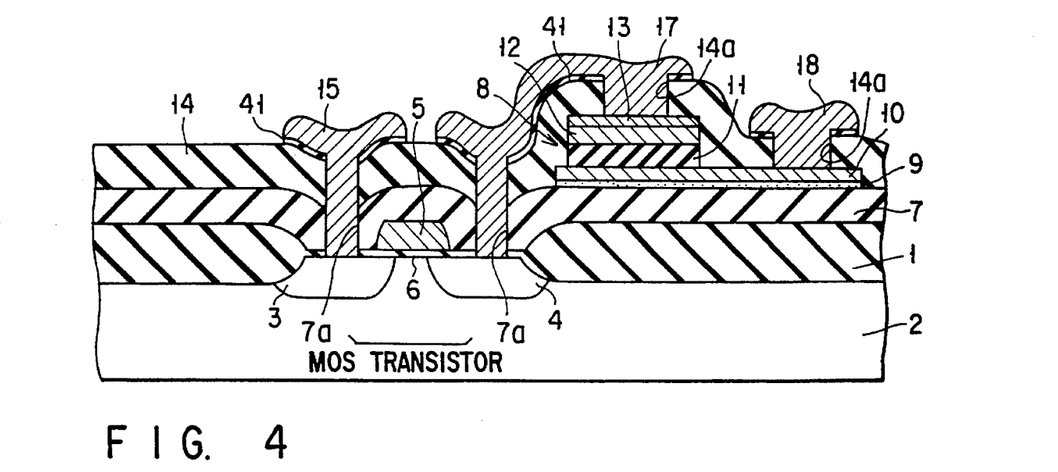
FIG. 4 is a cross sectional view showing a ferroelectric memory manufactured in Example 6 described herein later.

FIG. 4 shows a ferroelectric memory for Example 6. The reference numerals common with FIGS. 1 and 4 denote the same members of the memory and, thus, description thereof is omitted.

In Example 6, an AlN protective film 41 is also formed on the interlayer insulating film 14 in the vicinity of each of the openings 7a and 14a in addition to the AlN protective film 13 shown in FIG. 1. In this embodiment, the upper electrode 12 of the ferroelectric thin film capacitor 8 is covered with the protective film 13. In addition, the interlayer insulating film 14 directly covering the entire region of the capacitor 8 is covered with the protective film 41. It follows that hydrogen is prevented from being diffused into the upper electrode. Also, a reducing gas is prevented from being diffused into the capacitor through the side wall of the capacitor.

EXAMPLE 7

Figure 5:
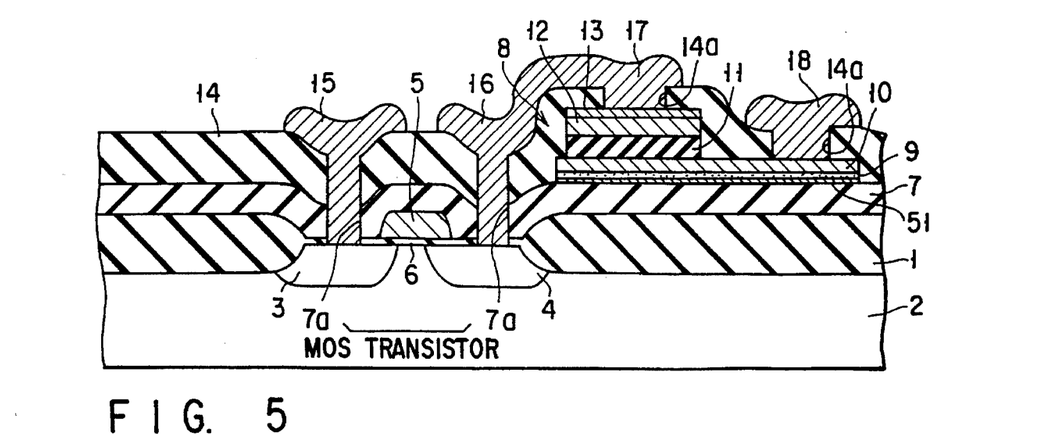
FIG. 5 is a cross sectional view showing a ferroelectric memory manufactured in Example 7 described herein later.

FIG. 5 shows a ferroelectric memory for Example 7. The reference numerals common with FIGS. 1 and 5 denote the same members of the memory and, thus, description thereof is omitted.

Example 7 shown in FIG. 5 is exactly equal in construction to Example 1 shown in FIG. 1, except that, in Example 7, an AlN protective film 51 having a thickness of 50 nm is formed between the BPSG film 7 and the adhesive layer 9. These protective film 51, adhesive layer 9 and lower electrode 10 can be formed simultaneously by patterning with a single mask, or can be formed separately.

EXAMPLE 8

Example 8 is exactly equal in construction to Example 3 shown in FIG. 2, except that, in Example 8, an MOD (Metallo-Organics Decomposition) thin film, 250 nm thick, of a bismuth stratified perovskite type compound of $SrBi_2Ta_2O_9$ is used for forming a ferroelectric thin film included in the ferroelectric thin film capacitor. Also, a ferroelectric $SiBi_2Ta_2O_9$ thin film having a thickness of 80 nm is used as a protective film in Example 8.

For forming the protective film, an MOD precursor solution of $SrBiTa_2O_9$ is coated by a single layer spin coating method, followed by drying and, then, calcinating the coated film. Further, the calcinated film is baked at 800° C. under an oxygen atmosphere so as to form the desired protective layer.

EXAMPLE 9

Example 9 is exactly equal in construction to Example 3 shown in FIG. 2, except that, in Example 9, an MOD thin film, 250 nm thick, of a bismuth stratified perovskite type compound of $SrBi_2Ta_2O_9$ is used for forming a ferroelectric thin film included in the ferroelectric thin film capacitor. Also, an amorphous film, 80 nm thick, formed of a non-ferroelectric oxide is used as a protective film in Example 9.

For forming the protective film, an MOD precursor solution of $SrBiTa_2O_9$ is coated by a single layer spin coating method, followed by drying and, then, calcinating the coated film at 400° C. to form a calcinated thin film. Further, the calcinated film is baked at 600° C., which is sufficiently lower than the crystallizing temperature of the compound noted above, under an oxygen atmosphere so as to fasten sufficiently the calcinated film and, thus, to form the desired protective layer.

EXAMPLE 10

Example 10 is exactly equal in construction to Example 3 shown in FIG. 2, except that, in Example 10, an MOD thin film, 250 nm thick, of a bismuth stratified perovskite type compound of $SrBi_2Ta_2O_9$ is used for forming a ferroelectric thin film included in the ferroelectric thin film capacitor. Also, a crystalline thin film, 80 nm thick, is used as a protective film in Example 10.

For forming the protective film (crystalline thin film), an MOD precursor solution of strontium tantalate ($SrTa_2O_6$), which partially overlaps in constituent elements with $SrBi_2Ta_2O_9$ used for forming the ferroelectric thin film included in the capacitor, is coated by a single layer spin coating method, followed by drying and, then, calcinating the coated film at 400° C. to form a calcinated thin film. Further, the calcinated film is baked at 800° C. under an oxygen atmosphere so as to form the desired protective layer.

EXAMPLE 11

Example 11 is exactly equal in construction to Example 3 shown in FIG. 2, except that, in Example 11, an MOD thin film, 250 nm thick, of a bismuth stratified perovskite type compound of $SrBi_2Ta_2O_9$ is used for forming a ferroelectric thin film included in the ferroelectric thin film capacitor. Also, a ferroelectric thin film, 80 nm thick, formed of $SrBi_2Nb_2O_9$ is used as a protective film in Example 11.

For forming the ferroelectric protective film, an MOD precursor solution of $SrBi_2Nb_2O_9$ is coated by a single layer spin coating method, followed by drying and, then, calcinating the coated film to form a calcinated thin film. Further, the calcinated film is baked at 850° C. under an oxygen atmosphere so as to form the desired protective layer.

EXAMPLE 12

Figure 6:
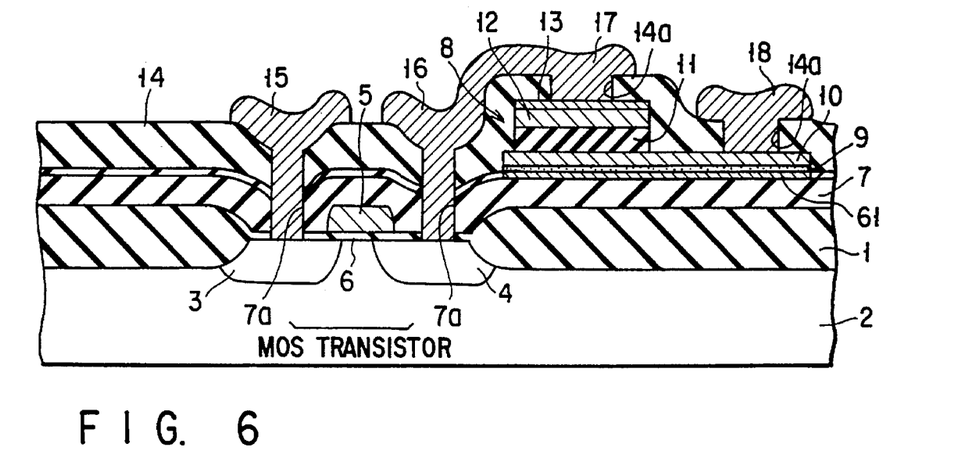
FIG. 6 is a cross sectional view showing a ferroelectric memory manufactured in Example 12 described herein later.

FIG. 6 shows a ferroelectric memory for Example 12. The reference numerals common with FIGS. 1, 5 and 6 denote the same members of the memory and, thus, description thereof is omitted.

Example 12 shown in FIG. 6 is exactly equal in construction to Example 1 shown in FIG. 1, except that, in Example 12, a ferroelectric thin film 61 having a thickness of 80 nm and made of $SrBi_2Ta_2O_9$ is formed as a protective film on the surface of the BPSG film 7. Also, a ferroelectric thin film 62 having a thickness of 100 nm and made of $SrBi_2Ta_2O_9$ is formed as another protective film on the surface of the upper electrode 12 included in the capacitor.

For forming the ferroelectric protective film 61, a precursor solution of $SrBi_2Ta_2O_9$ is coated by a single layer spin coating method, followed by drying and, then, calcinating the coated film to form a calcinated thin film. Further, the calcinated film is baked at 800° C. under an oxygen atmosphere so as to form the desired protective film 61. The ferroelectric thin film 62 is also formed similarly. Specifically, a precursor solution of $SrBi_2Ta_2O_9$ is coated by a single layer spin coating method, followed by drying and, then, calcinating the coated film to form a calcinated thin film. Further, the calcinated film is baked at 800° C. under an oxygen atmosphere so as to form the desired ferroelectric thin film 62.

EXAMPLE 13

Example 13 is exactly equal in construction to Example 1, except that, in Example 13, a protective film is not formed on the upper electrode, and that the ferroelectric thin film is formed of a Ta-rich ferroelectric material of $SrBi_2Ta_2O_9$.

For forming the ferroelectric thin film 61, the lower electrode formed in advance is coated by a spin coating method with a precursor solution of $SrBi_2Ta_2O_9$ containing Ta in an amount 20 mol % larger than the stoichiometric amount, followed by drying and, then, calcinating the coated film. These coating, drying and calcinating steps are performed repeatedly to form a calcinated thin film. Further, the calcinated thin film is baked at 800° C. under an oxygen atmosphere so as to form the desired ferroelectric thin film. The crystal structure and composition of the resultant thin film were analyzed by an X-ray diffractometry, IPC analysis, observation with an electron microscope, etc. It has been found that a ferroelectric phase and a paraelectric phase are present in a mixed form within the thin film. Also, much segregation of tantalum oxide has been found on the surface of the thin film.

EXAMPLE 14

Example 14 differs from Example 13 simply in the process of forming the ferroelectric thin film. For forming the ferroelectric thin film in Example 14, the lower electrode formed in advance is spin coated with a stoichiometric first solution of a precursor of $SrBi_2Ta_2O_9$, followed by drying and, then, calcinating the coated film. These coating, drying and calcinating steps are repeated twice to form a calcinated thin film. Further, the calcinated thin film is coated with a second precursor solution adjusted such that the amount of Ta contained in these first and second solutions is 20 mol % larger than the stoichiometric amount, followed by drying and, then, calcinating the coated film to form a calcinated film. Finally, the calcinated film is baked at 800° C. under an oxygen atmosphere to form a desired ferroelectric thin film. The crystal structure and composition of the resultant thin film were analyzed by an X-ray diffractometry, IPC analysis, observation with an electron microscope, etc. It has been found that the most portion of the thin film consists of a ferroelectric phase of $SrBi_2Ta_2O_9$. Also, segregation of tantalum oxide has been found on the surface alone of the thin film.

Comparative Example 1

Figure 7:
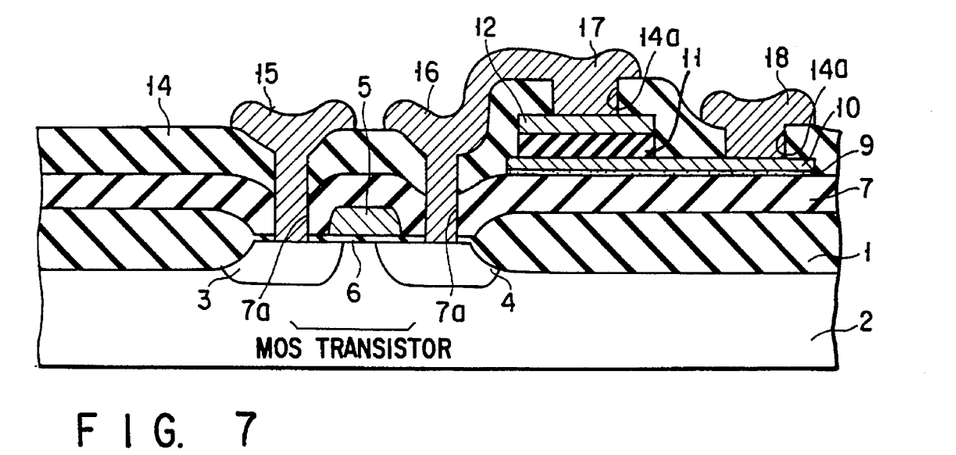
FIG. 7 is a cross sectional view showing a ferroelectric memory manufactured in Comparative Example 1 described herein later.

FIG. 7 shows a ferroelectric memory for Comparative Example 1. The reference numerals common with FIGS. 1 and 7 denote the same members of the memory and, thus, description thereof is omitted.

Comparative Example 1 is exactly equal in construction to Example 1 shown in FIG. 1, except that a protective film is not formed in Comparative Example 1. Incidentally, a thin film of $Pb(Zr_{0.4}Ti_{0.6})O_3$ having a thickness of 300 nm is used as a ferroelectric film in Comparative Example 1.

Comparative Example 2

Comparative Example 2 is exactly equal in construction to Example 1 shown in FIG. 1, except that a protective film is not formed in Comparative Example 2. Incidentally, a thin film of $SrBiTa_2O_9$ having a thickness of 300 nm is used as a ferroelectric film in Comparative Example 2

EXAMPLE 15

Figure 8:
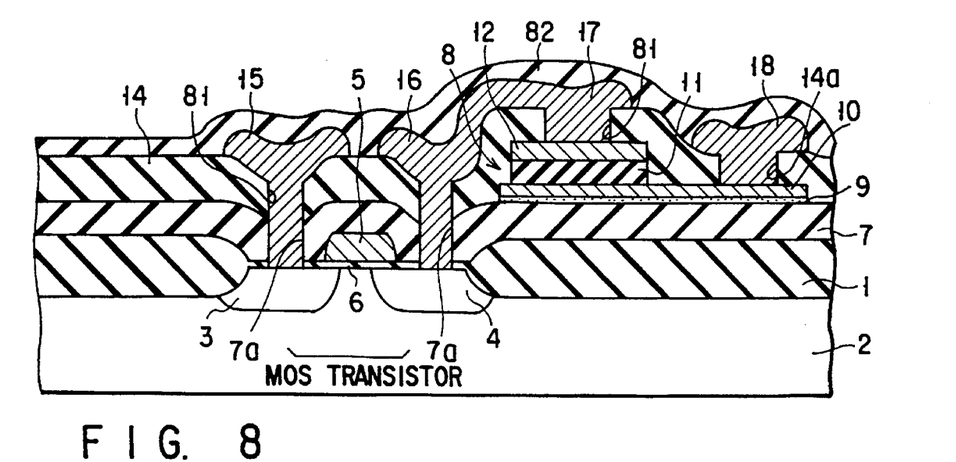
FIG. 8 is a cross sectional view showing a ferroelectric memory manufactured in Example 15 described herein later.

FIG. 8 shows a ferroelectric memory for Example 15. As apparent from the drawing, the memory for Example 15 can be obtained by forming a protective film 82 to cover the entire surface of the conventional memory shown in FIG. 7. The protective film 82 consists of an amorphous, non-dielectric thin film of $SrBi_2Ta_2O_9$ having a thickness of 100 nm. For forming the protective film 82, a ferroelectric thin film of $SrBi_2Ta_2O_9$ equal to that included in the ferroelectric thin film capacitor 8 is formed first on the entire surface, followed by baking the film at 600° C. under an oxygen atmosphere.

The ferroelectric memory prepared in each of Examples 1–15 and Comparative Examples 1–2 was subjected to a MOS sintering treatment within a diffusion furnace at 425° C. for 30 minutes under a nitrogen gas (forming gas) atmosphere containing 5% of hydrogen gas. In Comparative Examples 1 and 2, peeling of the capacitor took place at the interface between the ferroelectric thin film and the upper electrode. However, peeling of the upper electrode was not observed at all in any of the ferroelectric memories for Examples 1–15. Further, these ferroelectric memories were satisfactory in each of the ferroelectric hysteresis characteristics and MOS transistor characteristics and found to operate perfectly.

Incidentally, the materials of the lower electrode, ferroelectric thin film, upper electrode, protective film, electrode wiring, etc. used in the Examples described above are no more than examples. Needless to say, other materials can also be used, as desired.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A ferroelectric memory, comprising:
   a semiconductor substrate;
   a ferroelectric thin film capacitor with a laminate structure formed on the substrate, said laminate structure including two electrode layers and an oxide ferroelectric layer arranged between the two electrode layers; and
   a protective layer for preventing hydrogen from diffusing into the oxide ferroelectric layer, the ferroelectric thin film capacitor being overlaid with the protective layer.

2. The ferroelectric memory according to claim 1, wherein the protective layer comprises an oxide, the oxide having an element the same as an element included in the oxide ferroelectric layer.

3. The ferroelectric memory according to claim 2, wherein the protective layer comprises a partially crystallized layer.

4. The ferroelectric memory according to claim 2, wherein the protective layer comprises an amorphous layer.

5. The ferroelectric memory according to claim 1, wherein the protective layer comprises a nitride.

6. The ferroelectric memory according to claim 5, wherein the nitride is a nitride of aluminum.

7. The ferroelectric memory according to claim 5, wherein the nitride is a nitride of silicon.

8. The ferroelectric memory according to claim 5, wherein the nitride is a nitride of titanium.

9. The ferroelectric memory according to claim 1, wherein said protective layer comprises an oxide having the same composition as said oxide ferroelectric thin film.

10. The ferroelectric memory according to claim 1, wherein said protective layer has a thickness of 20 nm to 100 nm.

11. The ferroelectric memory according to claim 9, wherein said protective layer comprises a partially crystallized layer.

12. The ferroelectric memory according to claim 1, wherein an insulating film is formed to cover the entire substrate including said ferroelectric thin film capacitor, and said protective layer is formed to cover the entire region of said insulating layer.

13. The ferroelectric memory according to claim 1, wherein an electrode wiring is formed to be connected to each of said lower electrode and upper electrode, and said protective layer is formed to cover the entire substrate including said electrode wiring.

14. The ferroelectric memory according to claim 1, wherein an under-layer equal in composition and structure to said protective layer is formed between said semiconductor substrate and said ferroelectric thin film capacitor.

15. The ferroelectric memory according to claim 1, wherein said ferroelectric thin film capacitor is electrically connected to a MOS transistor formed separately on said semiconductor substrate via an electrode wiring of a laminate structure consisting of an aluminum nitride film and an aluminum-silicon alloy film, said protective layer and/or an insulating layer laminated on said protective layer being interposed between said capacitor and said transistor.

16. The ferroelectric memory according to claim 1, wherein said oxide ferroelectric layer comprises a bismuth layered perovskite type compound represented by general formula (I) given below:

$$(Bi_2O_2)^{2+}(A_{m-1}B_mO_{3m+1})^{2-} \qquad (I)$$

where A is at least one element selected from the group consisting of Bi, Pb, Ba, Sr, Ca, Na, K and Cd; B is at least one element selected from the group consisting of Ti, Nb, Ta, W, Mo, Fe, Co and Cr; and m is an integer of 1 to 5;

the concentration of said element B having a gradient in the thickness direction of said oxide ferroelectric thin film such that the element B is contained in an excessive amount at the interface with said upper electrode.

17. The ferroelectric memory according to claim 16, wherein said bismuth layer perovskite type compound is $SrBi_2(Ta_xNb_{1-x})_2O_9$ (x=0 to 1.0), and said element B is Ta or Nb.

18. A ferroelectric memory, comprising:
   a semiconductor substrate;
   an element isolating region formed on the surface of said substrate;
   a MOS transistor formed within an element region surrounded by said element isolating region and having a source region, a drain region and a gate electrode;
   a first insulating layer formed to cover the entire surface of the substrate;
   a ferroelectric thin film capacitor of a laminate structure formed on said first insulating film positioned on said element isolating region, said laminate structure comprising a lower electrode, a ferroelectric thin film and an upper electrode; and
   a protective layer formed to cover at least the upper surface of said capacitor and consisting essentially of a nitride of aluminum, silicon or titanium.

19. The ferroelectric memory according to claim 18, wherein said protective layer consists essentially of an oxide equal in composition to or common in some constituting elements with said oxide forming said oxide ferroelectric thin film.

20. The ferroelectric memory according to claim 18, wherein said protective layer has a thickness of 20 nm to 100 nm.

21. The ferroelectric memory according to claim 19, wherein said protective layer is a partially crystallized film or an amorphous film.

22. The ferroelectric memory according to claim 18, wherein a second insulating layer is formed to cover the entire substrate including said capacitor, and said protective layer is formed to cover the entire region of said second insulating layer.

23. The ferroelectric memory according to claim 18, wherein an electrode wiring is formed to be connected to each of said lower electrode and upper electrode, and said protective layer is formed to cover the entire substrate including said electrode wiring.

24. The ferroelectric memory according to claim 18, wherein an under-layer equal in composition and structure to said protective layer is formed between said semiconductor substrate and said ferroelectric thin film capacitor.

25. The ferroelectric memory according to claim 18, wherein said ferroelectric thin film capacitor is electrically connected to said MOS transistor via an electrode wiring of a laminate structure consisting of an aluminum nitride film and an aluminum-silicon alloy film, said first insulating layer being interposed between said capacitor and said transistor.

26. The ferroelectric memory according to claim 18, wherein said oxide ferroelectric thin film is formed of a bismuth stratified perovskite type compound represented by general formula (I) given below:

$$(Bi_2O_2)^{2+}(A_{m-1}B_mO_{3m+1})^{2-} \tag{I}$$

where A is at least one element selected from the group consisting of Bi, Pb, Ba, Sr, Ca, Na, K and Cd; B is at least one element selected from the group consisting of Ti, Nb, Ta, W, Mo, Fe, Co and Cr; and m is an integer of 1 to 5;

the concentration of said element B having a gradient in the thickness direction of said oxide ferroelectric thin film such that the element B is contained in an excessive amount at the interface with said upper electrode.

27. The ferroelectric memory according to claim 26, wherein said bismuth stratified perovskite type compound is $SrBi_2(Ta_xNb_{1-x})_2O_9$ (x=0 to 1.0), and said element B is Ta or Nb.

28. The ferroelectric memory according to claim 9, wherein the protective layer comprises an amorphous layer.

* * * * *